United States Patent
Yamashita et al.

(10) Patent No.: US 8,314,491 B2
(45) Date of Patent: Nov. 20, 2012

(54) MANUFACTURING METHOD OF SEMICONDUCTOR DEVICE AND SEMICONDUCTOR DEVICE

(75) Inventors: Soichi Yamashita, Kanagawa (JP); Tatsuo Migita, Kanagawa (JP); Tadashi Iijima, Oita (JP); Masahiro Miyata, Oita (JP); Masayuki Uchida, Kanagawa (JP); Takashi Togasaki, Kanagawa (JP); Hirokazu Ezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 190 days.

(21) Appl. No.: 12/845,937

(22) Filed: Jul. 29, 2010

(65) Prior Publication Data

US 2011/0024901 A1 Feb. 3, 2011

(30) Foreign Application Priority Data

Jul. 30, 2009 (JP) ................................. 2009-178179
Jun. 23, 2010 (JP) ................................. 2010-143085

(51) Int. Cl.
*H01L 23/48* (2006.01)
(52) U.S. Cl. ................................. 257/737; 257/E23.141
(58) Field of Classification Search .......... 257/737–738, 257/E23.141, 779–781, 784, 786, E23.069, 257/E23.023
See application file for complete search history.

(56) References Cited

U.S. PATENT DOCUMENTS

| | | | |
|---|---|---|---|
| 6,492,198 B2 | 12/2002 | Hwang | |
| 7,709,954 B2* | 5/2010 | Loo | 257/738 |
| 7,847,407 B2* | 12/2010 | Watanabe | 257/773 |
| 7,911,065 B2* | 3/2011 | Suh | 257/777 |
| 2009/0200664 A1 | 8/2009 | Migita et al. | |

FOREIGN PATENT DOCUMENTS

JP 2007-048931 2/2007

* cited by examiner

*Primary Examiner* — Hoa B Trinh
(74) *Attorney, Agent, or Firm* — Turocy & Watson, LLP (57) ABSTRACT

According to one embodiment, a manufacturing method of a semiconductor device attained as follows. A dielectric layer having a first opening and a second opening reaching an electrode terminal is formed by modifying a photosensitive resin film on a substrate on which the electrode terminal of a first conductive layer is provided. Next, a second conductive layer that is electrically connected to the electrode terminal is formed on the dielectric layer that includes inside of the first opening, and a third conductive layer that has an oxidation-reduction potential of which difference from the oxidation-reduction potential of the first conductive layer is smaller than a difference of the oxidation-reduction potential between the first conductive layer and the second conductive layer is formed on the second conductive layer. Next, a dielectric layer having a third opening reaching the third conductive layer and a fourth opening reaching the electrode terminal via the second opening is formed by modifying a photosensitive resin film, and a bump that is electrically connected to the third conductive layer is formed.

5 Claims, 7 Drawing Sheets

MANUFACTURING METHOD OF SEMICONDUCTOR DEVICE AND SEMICONDUCTOR DEVICE

CROSS-REFERENCE TO RELATED APPLICATIONS

This application is based upon and claims the benefit of priority from the prior Japanese Patent Application No. 2009-178179, filed on Jul. 30, 2009 and 2010-143085, filed on Jun. 23, 2010; the entire contents all of which are incorporated herein by reference.

FIELD

Embodiments described herein relate generally to a manufacturing method of a semiconductor device and a semiconductor device.

BACKGROUND

In recent years, there is a demand for improvement in a device operation speed and increase in memory capacity for achieving high integration and high performance of a semiconductor device. Recently, a COC (Chip on Chip) device, in which a logic chip and a large-capacity DRAM are stacked, is also developed instead of an eDRAM (Embedded Dynamic Random Access Memory) chip.

In the COC device, in one chip, two types of terminals, i.e., a terminal (hereinafter, first terminal) for connection to the other chip and a terminal (hereinafter, second terminal) for connection to the outside are required in some cases. Moreover, the first terminal and the second terminal are required to be formed into different shapes appropriate for each of them. Specifically, the first terminal is required to form a bump to have sufficient height. The second terminal is required to use an electrode pad formed in a chip. In forming such two types of terminals, the terminals are formed by using, for example, a redistribution technology, for example, in Japanese Patent Application Laid-open No. 2008-84962.

In Japanese Patent Application Laid-open No. 2008-84962, a tip side of a redistribution is patterned into a pad shape to be a connection terminal portion. Then, especially, this connection terminal portion is plated on its surface with nickel (Ni) and gold (Au), so that an electrical contactability and a bondability in wire bonding can be improved. In other words, Japanese Patent Application Laid-open No. 2008-84962 discloses that a laminated structure of nickel (Ni) and gold (Au) is applied only to the surface layer of the second terminal. However, Japanese Patent Application Laid-open No. 2008-84962 does not disclose a specific process of forming this structure selectively on the second terminal.

DETAILED DESCRIPTION

In general, according to one embodiment, a manufacturing method of a semiconductor device attained as follows. A dielectric layer having a first opening and a second opening reaching an electrode terminal is formed by modifying a photosensitive resin film on a substrate on which the electrode terminal of a first conductive layer is provided. Next, a second conductive layer that is electrically connected to the electrode terminal is formed on the dielectric layer that includes inside of the first opening, and a third conductive layer that has an oxidation-reduction potential of which difference from the oxidation-reduction potential of the first conductive layer is smaller than a difference of the oxidation-reduction potential between the first conductive layer and the second conductive layer is formed on the second conductive layer. Next, a dielectric layer having a third opening reaching the third conductive layer and a fourth opening reaching the electrode terminal via the second opening is formed by modifying a photosensitive resin film, and a bump that is electrically connected to the third conductive layer is formed.

Exemplary embodiments of a manufacturing method of a semiconductor device and a semiconductor device will be explained below in detail with reference to the accompanying drawings. The present invention is not limited to the following embodiments. In the following drawings, the scale of each component may be different from the actual one for easy understanding.

First Embodiment

Figure 1A:
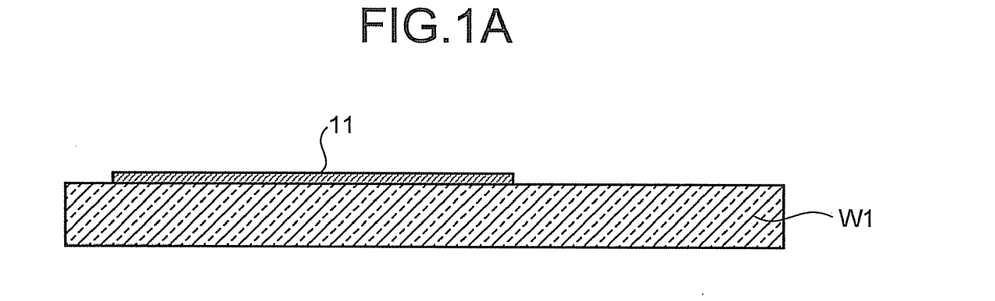
FIG. 1A to FIG. 1N are cross-sectional views explaining a manufacturing method of a semiconductor device in a first embodiment.
Figure 1B:
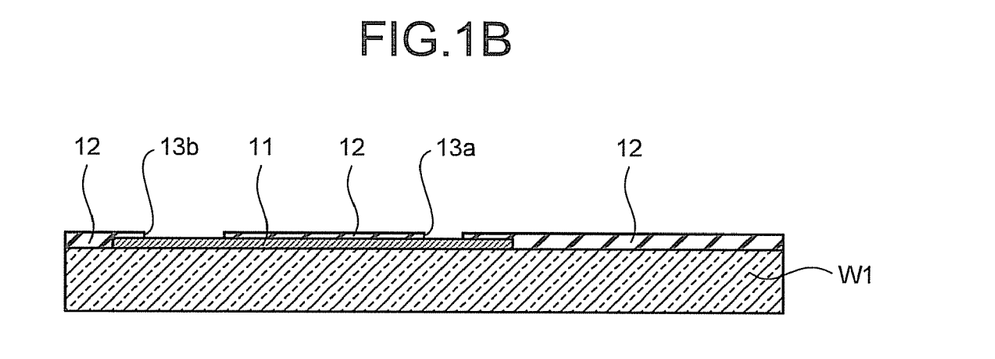
Figure 1C:
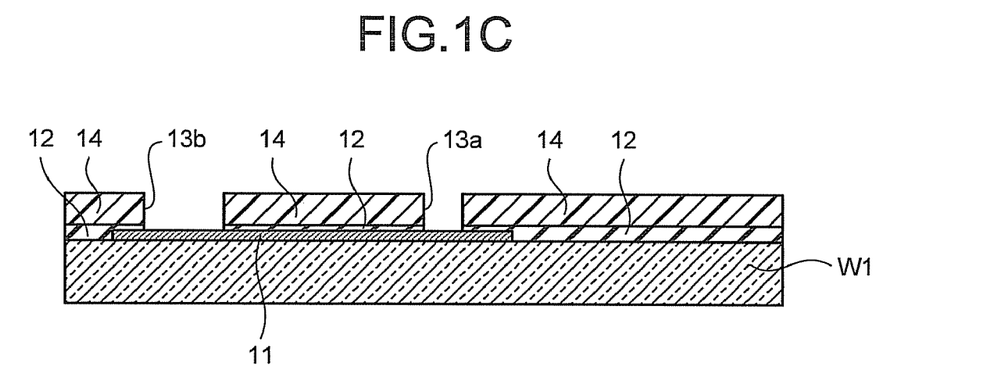
Figure 1D:
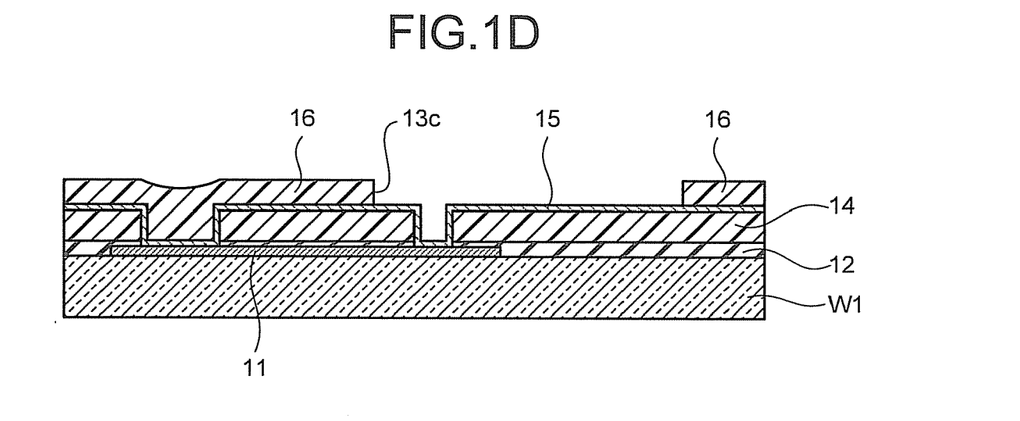
Figure 1E:
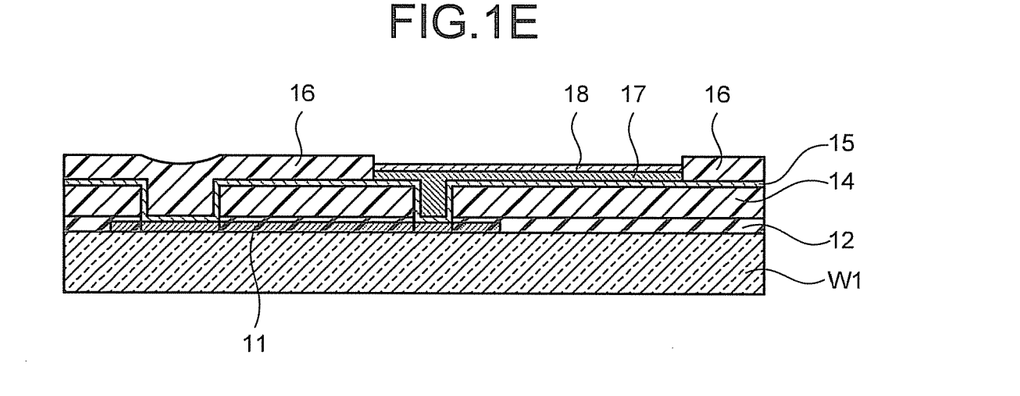
Figure 1F:
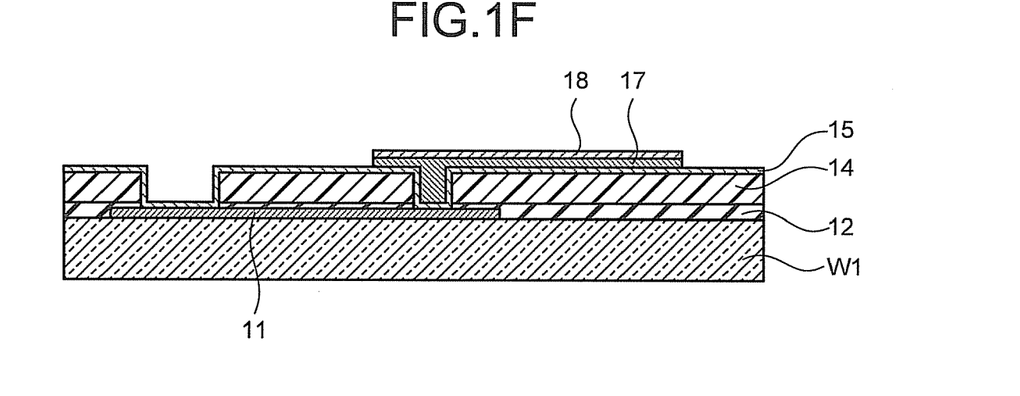
Figure 1G:
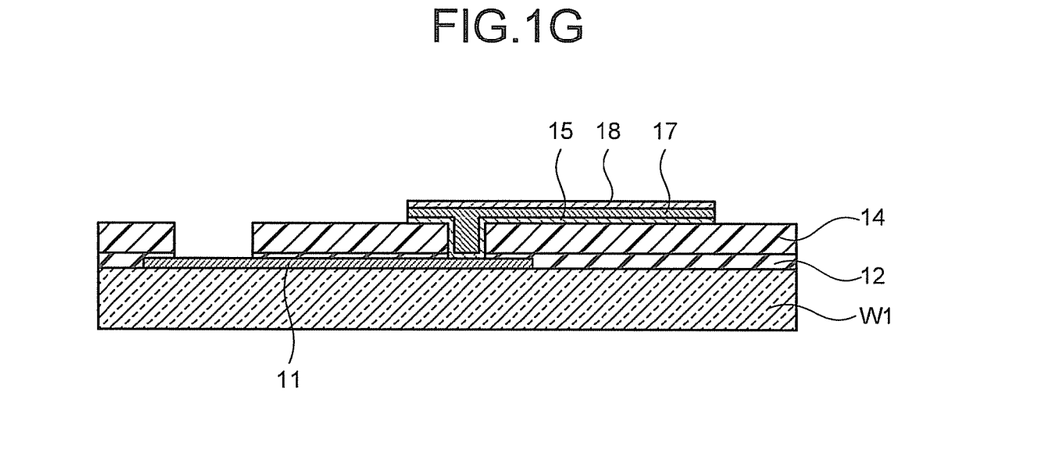
Figure 1H:
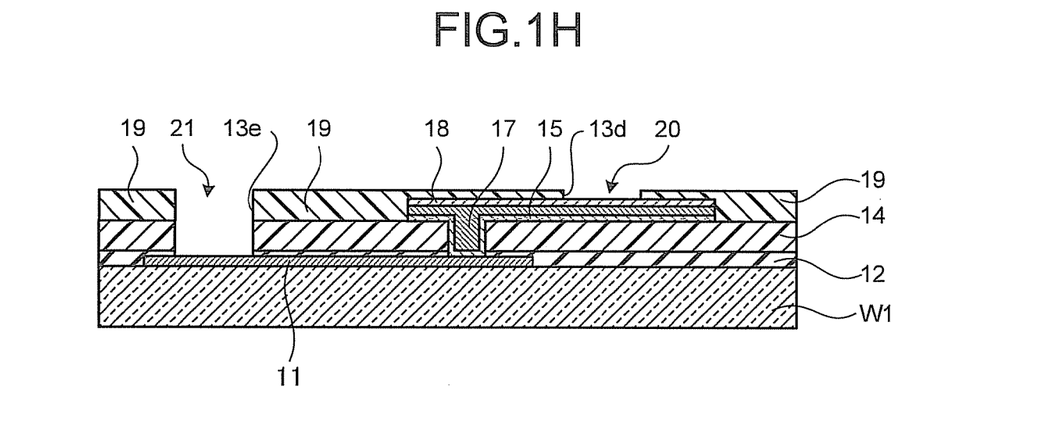
Figure 1I:
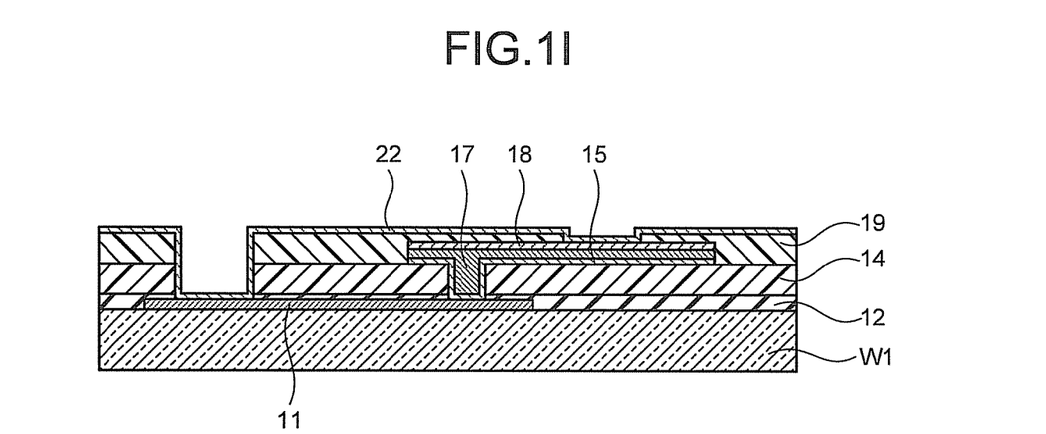
Figure 1J:
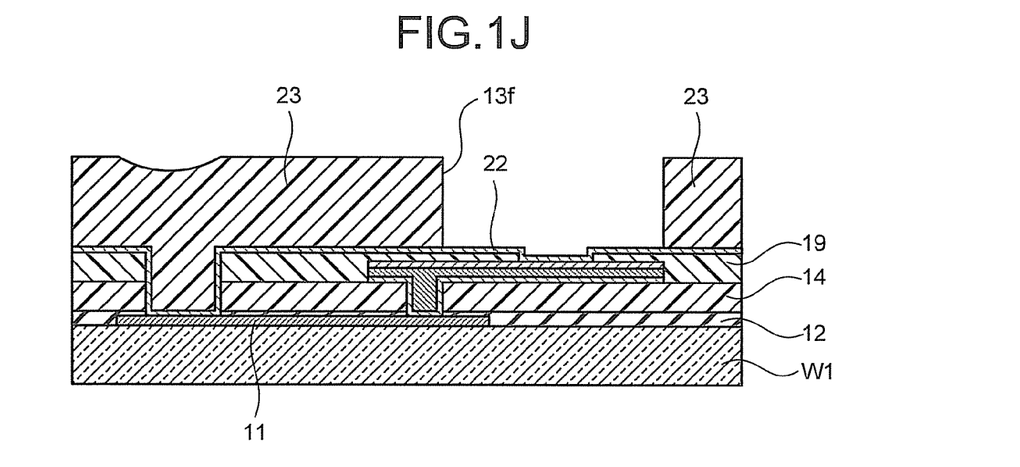
Figure 1K:
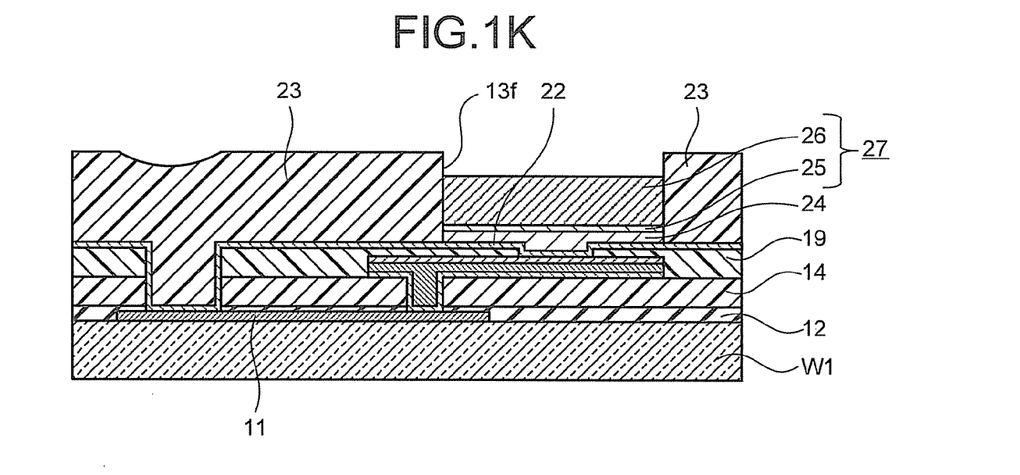
Figure 1L:
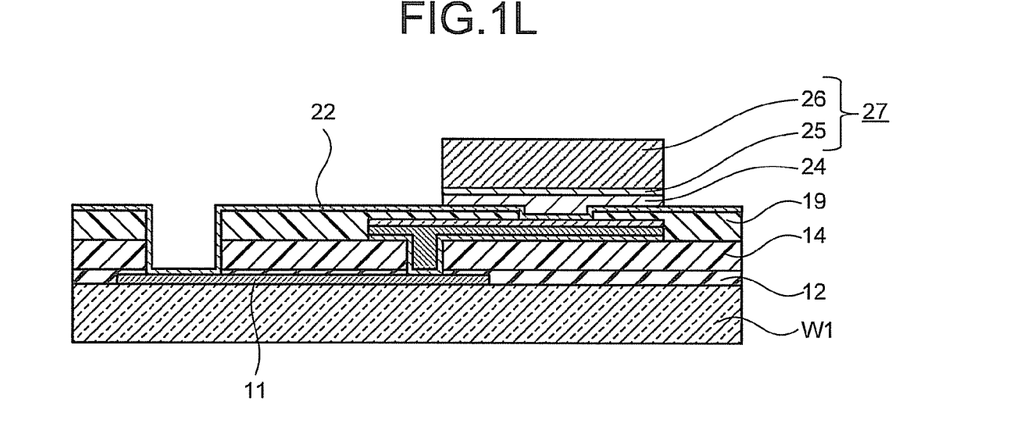
Figure 1M:
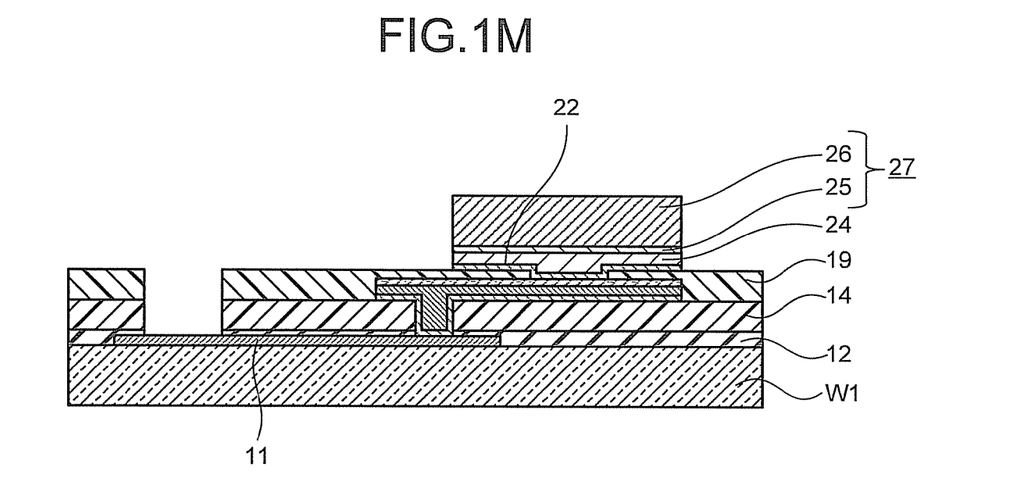
Figure 1N:
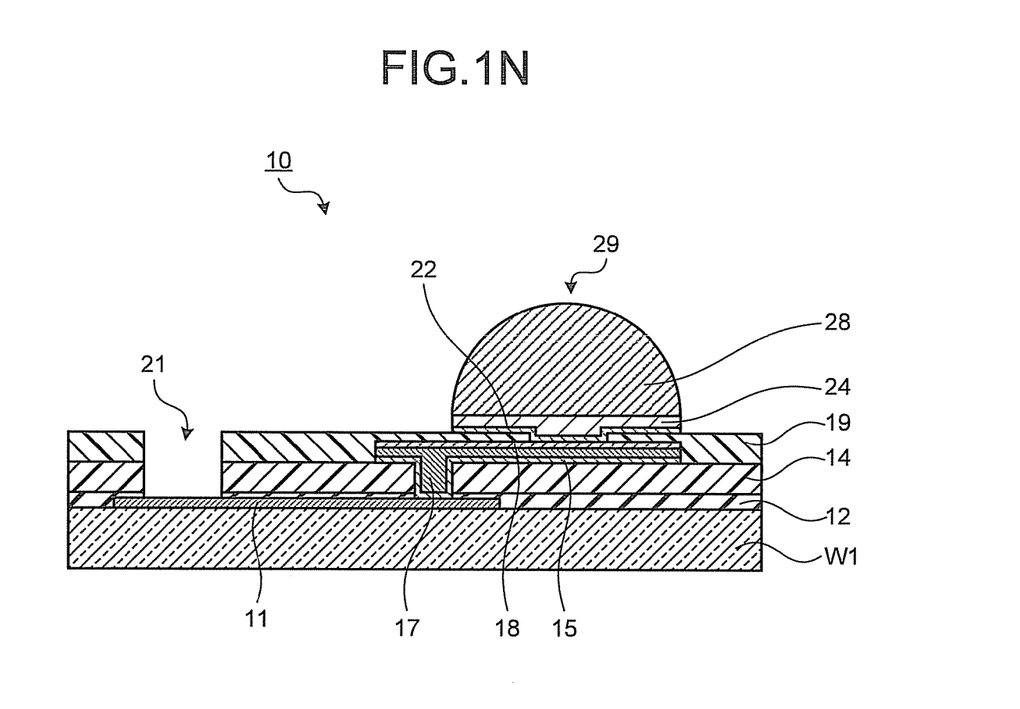

FIG. 1A to FIG. 1N are cross-sectional views schematically explaining a manufacturing method of a semiconductor device according to the first embodiment. First, a semiconductor wafer (substrate) used in the present embodiment is explained. As shown in FIG. 1A, on a surface of a semiconductor substrate W1 (hereinafter, simply "wafer W1") in which an LSI (Large Scale Integrated Circuit (not shown)) is formed on a semiconductor such as silicon, an electrode pad 11 as an electrode terminal of the LSI is formed. The material constituting the electrode pad 11, for example, includes aluminum (Al). In the present embodiment, the case is explained in which the electrode pad 11 comprises aluminum (Al), however, it goes without saying that, as aluminum (Al) in this example, an aluminum (Al) alloy in which aluminum (Al) is the main component, such as aluminum (Al)-copper (Cu) and aluminum (Al)-copper (Cu)-silicon (Si), used in a typical semiconductor device can be used. The following processes are performed using the wafer W1 on which such the electrode pad 11 is formed.

First, as shown in FIG. 1B, a passivation film 12 having openings 13a and 13b at predetermined positions on the electrode pad 11 is formed on the entire surface of the wafer W1. The material constituting the passivation film 12, for example, includes silicon nitride (SiN). In the present embodiment, the case is explained in which the passivation film 12 comprises silicon nitride (SiN).

A forming method of the passivation film 12 is explained. First, a silicon nitride film (SiN film) to be the passivation film 12 is formed on the entire surface of the wafer W1. Moreover, a resist pattern having openings at the predetermined positions (positions corresponding to the openings 13a and 13b) on the electrode pad 11 is formed on the silicon nitride film (SiN film), the passivation film 12 having the openings 13a and 13b at the predetermined positions on the electrode pad 11 is formed by an etching technique by using this resist pattern as a mask, and thereafter the resist pattern is removed.

Next, as shown in FIG. 1C, a first dielectric layer 14 having the openings 13a and 13b at the predetermined positions on the electrode pad 11 is formed on the entire surface of the wafer W1. As the material constituting the first dielectric layer 14, for example, a polyimide resin, an epoxy resin, or a photosensitive resin such as resin obtained by sensitizing a silicone resin is used. In the present embodiment, the case is explained in which the first dielectric layer 14 comprises a photosensitive polyimide resin.

A forming method of the first dielectric layer 14 is explained. First, a photosensitive polyimide film is formed on the entire surface of the wafer W1. Next, the predetermined positions (positions corresponding to the openings 13a and 13b) on the electrode pad 11 are exposed by using a photolithography technique. Next, development is performed by using, for example, a strong alkaline solution as a developer to form the openings 13a and 13b reaching the electrode pad 11 at the predetermined positions on the electrode pad 11.

Then, baking is performed to modify the photosensitive polyimide film into the first dielectric layer 14. Whereby, the first dielectric layer 14 is formed, which has the openings 13a and 13b reaching the electrode pad 11 at the predetermined positions on the electrode pad 11. The first dielectric layer 14 is in a state where further patterning cannot be performed by being subjected to the baking. Moreover, the photosensitive polyimide film can be a positive type or a negative type.

Next, as shown in FIG. 1D, a metal layer 15 is formed on the entire surface of the wafer W1 by using the sputtering method, the CVD method, the ALD method, or the like. The Metal layer 15 functions as a current-carrying layer in an electrolytic plating process of copper that is a process to be described later. In the passivation film 12 and the first dielectric layer 14, the openings 13a and 13b reaching the electrode pad 11 are formed at a portion on the electrode pad 11. Therefore, the Metal layer 15 is in contact with the electrode pad 11 at the portion on the electrode pad 11.

The material constituting the Metal layer 15, for example, includes a copper (Cu) based material. The Metal layer 15 can have a multilayer structure, and in the present embodiment, explanation is given for the case where the Metal layer 15 is configured to have a laminated structure of titanium (Ti)/copper (Cu). Titanium (Ti) in the Metal layer 15 is used to suppress diffusion between the electrode pad 11 and a redistribution layer 17 to be described later and improve adhesion therebetween.

After forming the Metal layer 15, a resist pattern 16 as a mask layer having an opening 13c is formed on the Metal layer 15 as shown in FIG. 1D by a typical lithography process of resist application, exposure, and development. This opening 13c is formed in a wiring pattern shape at a position at which a redistribution and a desired circuit are formed and the opening 13a is included. In other words, the resist pattern 16 is formed to have a predetermined pattern opening for forming the redistribution and the desired circuit.

After forming the resist pattern 16 on the Metal layer 15, for example, copper (Cu) is deposited on the Metal layer 15 in the opening 13c by an electrolytic plating method to form the redistribution layer 17 comprising copper (Cu) in the opening 13c as shown in FIG. 1E. This redistribution layer 17 is electrically connected to the electrode pad 11 via the Metal layer 15. Next, as shown in FIG. 1E, for example, nickel (Ni) is deposited as a conductive protective layer 18 on the redistribution layer 17 by the electrolytic plating method to form the conductive protective layer 18 comprising nickel (Ni) on the uppermost layer of the redistribution layer 17 comprising copper (Cu).

Thereafter, as shown in FIG. 1F, the resist pattern 16 is removed by using chemicals such as resist stripper. Then, as shown in FIG. 1G, the wet etching is performed with the conductive protective layer 18 and the redistribution layer 17 as an etching mask to remove the Metal layer 15 other than a portion covered with the redistribution layer 17 and the conductive protective layer 18. The reason to remove the Metal layer 15 in this process is that the photosensitive resin formed on the first dielectric layer 14 in the next process is modified to be directly used as a dielectric layer together with the first dielectric layer 14. In other words, if unnecessary Metal layer 15 is not removed at this stage, after the photosensitive resin is formed on the first dielectric layer 14, the Metal layer 15 between the first dielectric layer 14 and the photosensitive resin cannot be removed.

Next, as shown in FIG. 1H, a second dielectric layer 19 is formed on the entire surface of the wafer W1, which has an opening 13d at a predetermined position on the conductive protective layer 18 and an opening 13e at a predetermined position (position same as the opening 13b) on the electrode pad 11. In other words, the second dielectric layer 19 is formed on the first dielectric layer 14 and the conductive protective layer 18 in a state of having the opening 13d and the opening 13e.

As the material constituting the second dielectric layer 19, for example, a polyimide resin, an epoxy resin, or a photosensitive resin such as resin obtained by sensitizing a silicone resin is used. In the present embodiment, the case is explained in which the second dielectric layer 19 comprises photosensitive polyimide. The same material is used for the first dielectric layer 14 and the second dielectric layer 19 in this example, however, different materials can be used for the first dielectric layer 14 and the second dielectric layer 19.

A forming method of the second dielectric layer 19 is explained. First, a photosensitive polyimide film is formed on the entire surface of the wafer W1. Next, the predetermined position on the conductive protective layer 18 and the predetermined position (position corresponding to the opening 13b) on the electrode pad 11 are exposed by using the photolithography technique. Next, development is performed by using, for example, a strong alkaline solution as the developer to form the opening 13d reaching the conductive protective layer 18 at the predetermined position on the conductive protective layer 18. Moreover, development is performed to form the opening 13e reaching the electrode pad 11 via the opening 13b.

Then, baking is performed to modify the photosensitive polyimide film into the second dielectric layer 19. Whereby, the second dielectric layer 19 is formed, which has the opening 13d reaching the conductive protective layer 18 at the predetermined position on the conductive protective layer 18 to be an internal connection terminal 20 and the opening 13e reaching the electrode pad 11 via the opening 13b at the position corresponding to an external connection terminal 21. The second dielectric layer 19 is in a state where further patterning cannot be performed by being subjected to the baking. Moreover, the photosensitive polyimide film can be a positive type or a negative type.

The internal connection terminal 20 in this example is a terminal formed by exposing the conductive protective layer 18 from the second dielectric layer 19. A solder bump to be described later is formed on this internal connection terminal 20. The external connection terminal 21 is a terminal formed by exposing the electrode pad 11 from the second dielectric layer 19 and the first dielectric layer 14. This external connection terminal 21 is a bonding pad for wire bonding for connecting to the outside, and is a terminal for supplying power, a signal, and the like from outside of the semiconductor device by being subjected to bonding with gold (Au) wires or the like.

In the present embodiment, in a state where the conductive protective layer 18 comprising nickel (Ni) is laminated to the redistribution layer 17 comprising copper (Cu), development of the photosensitive polyimide film to be the second dielectric layer 19 is performed by using a strong alkaline solution as the developer. In other words, at the development, the redistribution layer 17 comprising copper (Cu) is not exposed because the redistribution layer 17 is covered with the conductive protective layer 18 comprising nickel (Ni), and development of the photosensitive polyimide film by the strong alkaline solution is performed in a state where the conductive protective layer 18 is exposed to the surface.

Figure 2:
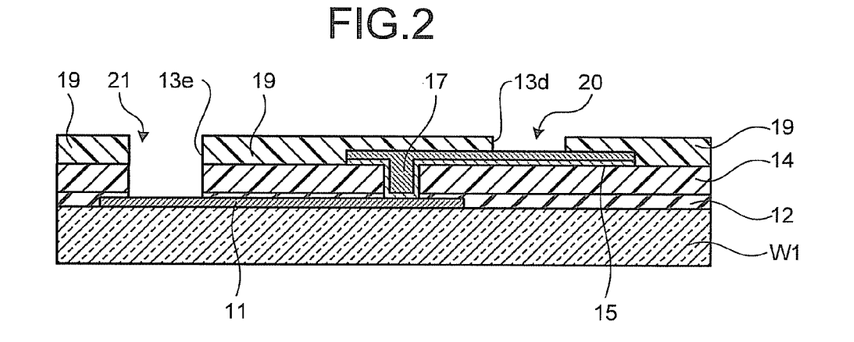
FIG. 2 is a cross-sectional view explaining a manufacturing method of a semiconductor device of a comparison example.

On the other hand, FIG. 2 is a cross-sectional view schematically explaining a manufacturing method of a semiconductor device of a comparison example. FIG. 2 illustrates the state where the conductive protective layer 18 comprising nickel (Ni) is not laminated to the redistribution layer 17 comprising copper (Cu) and the redistribution layer 17 comprising copper (Cu) is exposed. When development of the photosensitive polyimide film by the strong alkaline solution is performed in this state, the redistribution layer 17 comprising copper (Cu) that is exposed from the opening 13d and the electrode pad 11 comprising aluminum (Al) that is exposed from the opening 13e are in the state of being present in the strong alkaline solution. In other words, two types of dissimilar metals (corresponding to anode and cathode) of copper (Cu) and aluminum (Al) having different ionization tendencies and largely different oxidation-reduction potentials are present in the strong alkaline solution. The oxidation-reduction potential of aluminum (Al) is −1.676 V and the oxidation-reduction potential of copper (Cu) is 0.340 V, so that the difference of the oxidation-reduction potential between both of them is about 2 V.

Then, a cell effect (electrolysis) occurs in the developer at the development of the photosensitive polyimide film, and gas such as hydrogen ($H_2$) gas and oxygen ($O_2$) gas is generated in the developer due to the potential difference between copper (Cu) and aluminum (Al). This gas is generated in a peripheral portion of the openings 13d and 13e from which the redistribution layer 17 and the electrode pad 11 are exposed. Therefore, a problem may occur that the photosensitive polyimide film on the first dielectric layer 14 is separated from the first dielectric layer 14 due to generation of this gas. This is a problem that does not occur, for example, when the opening is formed by performing resist application, exposure, and development on the redistribution layer 17 in a state where the electrode pad 11 comprising aluminum (Al) is covered with the current-carrying layer comprising a copper (Cu) based material, and this separated state of the photosensitive polyimide film remains even after the photosensitive polyimide film is modified into the second dielectric layer 19, thereby causing degradation of reliability of the semiconductor device.

However, in the present embodiment, the conductive protective layer 18 comprising nickel (Ni) is laminated to the redistribution layer 17 comprising copper (Cu), and development of the photosensitive polyimide film is performed in a state where two types of dissimilar metals (corresponding to anode and cathode) of nickel (Ni) of the conductive protective layer 18 and aluminum (Al) of the electrode pad 11 are present in the strong alkaline solution. The oxidation-reduction potential of aluminum (Al) is −1.676 V and the oxidation-reduction potential of nickel (Ni) is −0.257 V, so that the difference of the oxidation-reduction potential between both of them is about 1.4 V. In other words, the potential difference between the two types of dissimilar metals present in the strong alkaline solution is reduced significantly compared with the case of the configuration shown in FIG. 2.

Whereby, the cell effect (electrolysis) at the development of the photosensitive polyimide film due to the potential difference between two types of dissimilar metals present in the developer is suppressed significantly and the amount of gas to be generated, such as hydrogen ($H_2$) gas, can be reduced significantly. Therefore, it is prevented that the photosensitive polyimide film (the second dielectric layer 19) is separated from the first dielectric layer 14 or the like due to generation of this gas and thus degradation of reliability of the semiconductor device can be prevented.

In the present embodiment, nickel (Ni) is used for the conductive protective layer 18, however, the material used for the conductive protective layer 18 is not limited to nickel (Ni). As the conductive protective layer 18, a metal material having the oxidation-reduction potential of which difference from the oxidation-reduction potential of aluminum (Al) is smaller than the difference of the oxidation-reduction potential between aluminum (Al) and copper (Cu) can be used. When the metal material satisfying such a condition is used for the conductive protective layer 18, the cell effect (electrolysis) at the development of the photosensitive polyimide film due to the potential difference between two types of dissimilar metals present in the developer is suppressed significantly compared with the case where the conductive protective layer 18 is not provided, and therefore the amount of gas to be generated, such as hydrogen ($H_2$) gas, can be reduced significantly. Whereby, it is prevented that the photosensitive polyimide film on the first dielectric layer 14 is separated from the first dielectric layer 14 or the like due to generation of this gas and thus degradation of reliability of the semiconductor device can be prevented.

Such a metal material, for example, includes manganese (Mn), tantalum (Ta), zinc (Zn), chrome (Cr), cobalt (Co), tin (Sn), and lead (Pb) in addition to nickel (Ni).

In a semiconductor device disclosed in Japanese Patent Application Laid-open No. 2008-84962, a configuration is disclosed in which a laminated structure of nickel (Ni)/gold (Au) is provided on a surface of a connection terminal portion. However, gold (Au) is provided on the surface layer of the connection terminal portion in this configuration, so that provision of nickel (Ni) on a lower layer of gold (Au) have no meaning to the above described suppression of gas generation at the development of the photosensitive polyimide film due to the potential difference between two types of dissimilar metals present in the developer.

Next, as shown in FIG. 1I, an under bump metal (UBM) layer 22 is formed on the entire surface of the wafer W1 by using the sputtering method, the CVD method, the ALD method, or the like. The UBM layer 22 functions as the current-carrying layer in a plating process of the solder bump that is a process to be described later. In the second dielectric layer 19, the opening 13d reaching the conductive protective layer 18 is formed at a portion on the conductive protective layer 18. Therefore, the UBM layer 22 is in contact with the conductive protective layer 18 at the portion on the conductive protective layer 18. Moreover, in the first dielectric layer 14 and the second dielectric layer 19, the opening 13e is formed at a portion on the electrode pad 11, so that the UBM layer 22 is in contact with the electrode pad 11 at the portion on the electrode pad 11.

The material constituting the UBM layer 22, for example, includes a Ti based material, such as titanium (Ti) and titanium tungsten (TiW). In the present embodiment, explanation is given for the case where the UBM layer 22 comprises a titanium (Ti) film. The UBM layer 22 can have a multilayer structure.

After forming the UBM layer 22, a resist pattern 23 as a mask layer having an opening 13f is formed on the UBM layer 22 as shown in FIG. 1J by a typical lithography process of resist application, exposure, and development. This opening 13f is formed at a position at which the solder bump is formed and the opening 13d is included. This opening 13f is used as an opening for forming the solder bump.

After forming the resist pattern 23 on the UBM layer 22, as shown in FIG. 1K, for example, nickel (Ni) film is formed in the opening 13f as a barrier metal layer 24 for the solder bump by the plating method, and then, for example, a copper (Cu) film 25 and a tin (Sn) film 26 are formed in this order in the opening 13f as a solder plating film 27 for the solder bump by the electrolytic plating method. The barrier metal layer 24 suppresses diffusion of tin (Sn) included in a solder bump 28 to be described later.

Thereafter, as shown in FIG. 1L, the resist pattern 23 is removed by using chemicals such as resist stripper. Then, as shown in FIG. 1M, the wet etching is performed with the solder plating film 27 as an etching mask to remove the UBM layer 22 other than a portion covered with the solder plating film 27.

Thereafter, a reflow process is performed by using flux to melt and solidify the solder plating film 27 to be molded in a round shape. At this time, it is applicable that the barrier metal layer 24 is dissolved in the solder plating film 27. Whereby, as shown in FIG. 1N, a first semiconductor chip 10 is obtained in which the solder bump 28 is formed on the redistribution layer 17 (on the barrier metal layer 24) to form an external connection terminal 29. The processes as described above are performed, so that it is prevented that the second dielectric layer 19 is separated from the first dielectric layer 14 due to generation of gas during a manufacturing process and thus the semiconductor device with excellent reliability can be manufactured.

Figure 3:
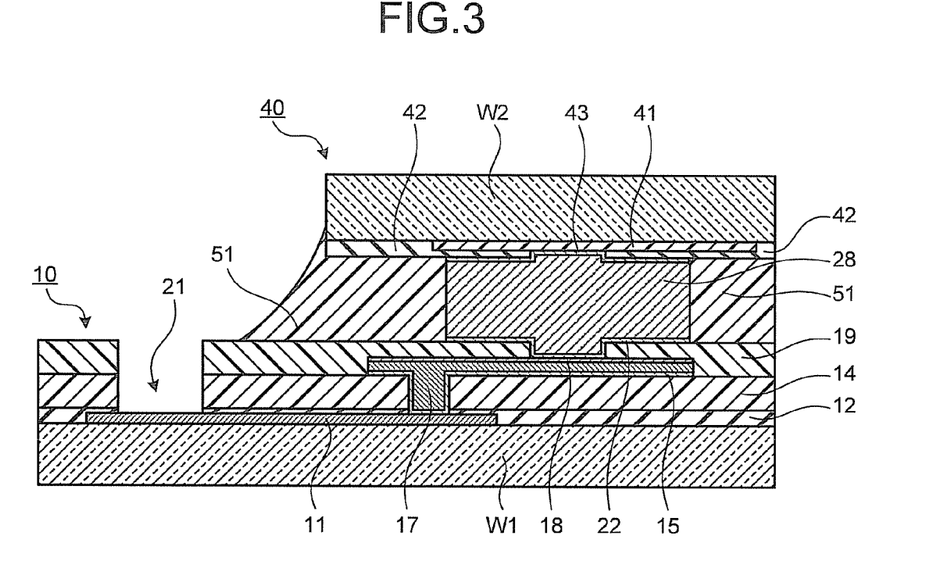
FIG. 3 is a cross-sectional view schematically explaining a configuration of a chip-stack semiconductor device in the first embodiment.

FIG. 3 is a cross-sectional view schematically explaining a configuration of a chip-stack semiconductor device (COC device) in which the semiconductor device in the present embodiment is used. FIG. 3 schematically illustrates the configuration of the chip-stack semiconductor device in which the above described first semiconductor chip 10 and a second semiconductor chip 40 as another electronic component are stacked by using a COC method. The second semiconductor chip 40 includes an electrode pad 41 as an electrode terminal of the LSI on a surface of a semiconductor substrate W2 in which, for example, the LSI (Large Scale Integrated Circuit (not shown)) is formed on a semiconductor such as silicon. The electrode pad 41, for example, comprises aluminum (Al). The electric component that is stacked with the above first semiconductor chip 10 is not limited to the semiconductor chip and can be, for example, a chip of a passive element.

The electrode pad 41 is covered with a dielectric layer 42 in a state where part of a connection area is open, and the connection area functions as the external connection terminal. Then, as shown in FIG. 3, the solder bump 28 is connected to this external connection terminal via a barrier metal layer 43, so that the first semiconductor chip 10 and the second semiconductor chip 40 are electrically connected. As the barrier metal layer 43, for example, a nickel (Ni) film is used. A gap between the first semiconductor chip 10 and the second semiconductor chip 40 is sealed with a seal resin 51. The external connection terminal of the second semiconductor chip 40 can be configured to have the solder bump.

Supply of power, a signal, and the like between the first semiconductor chip 10 and the second semiconductor chip 40 is performed through the redistribution layer 17 and the solder bump 28 included in the first semiconductor chip 10 and the electrode pad 41 included in the second semiconductor chip 40.

Moreover, on the external connection terminal 21 included in the first semiconductor chip 10, bonding by gold (Au) wires or the like is performed (not shown). Then, supply of power, a signal, and the like from the outside of the semiconductor device to the first semiconductor chip 10 is performed through the gold (Au) wires or the like connected on the external connection terminal 21.

In such a chip-stack semiconductor device, it is prevented that the second dielectric layer 19 is separated from the first dielectric layer 14 due to generation of gas during the manufacturing process of the first semiconductor chip 10 and thus the chip-stack semiconductor device with excellent reliability can be realized.

As described above, in the semiconductor device according to the present embodiment, the conductive protective layer 18 comprising nickel (Ni) is provided on the redistribution layer 17 comprising copper (Cu). Therefore, separation of the second dielectric layer 19 from the first dielectric layer 14 at the time of forming the second dielectric layer 19 is prevented and thus the semiconductor device with excellent reliability can be realized.

Moreover, as described above, in the manufacturing method of the semiconductor device according to the present embodiment, the conductive protective layer 18 comprising nickel (Ni) is laminated to the redistribution layer 17 comprising copper (Cu). In other words, the difference of the oxidation-reduction potential between two types of dissimilar metals present in the developer at the development of the photosensitive polyimide film to be the second dielectric layer 19 becomes smaller than the difference of the oxidation-reduction potential between aluminum (Al) of the electrode pad 11 and copper (Cu) of the redistribution layer 17. Therefore, the cell effect (electrolysis) due to the potential difference between two types of dissimilar metals present in the developer is suppressed significantly and thus the amount of gas to be generated, such as hydrogen ($H_2$) gas and oxygen ($O_2$) gas, at the development of the photosensitive polyimide film can be reduced significantly. Whereby, it is prevented that the photosensitive polyimide film to be the second dielectric layer 19 is separated from the first dielectric layer 14 due to generation of gas and thus the semiconductor device with excellent reliability can be manufactured.

In the above present embodiment, the case is explained as an example in which the electrode pad 11 comprises aluminum (Al) and the redistribution layer 17 comprises copper (Cu) in the first semiconductor chip 10, however, the present invention is not limited to this combination. In other words, a constituent material of the electrode pad 11 and a constituent material of the redistribution layer 17 in the first semiconductor chip 10 can be arbitrary changed. The metal material of the conductive protective layer 18 laminated to the redistribution layer 17 is selected so that the difference of the oxidation-reduction potential from the electrode pad 11 becomes small, for example, becomes smaller than the difference of the oxidation-reduction potential between aluminum (Al) and copper (Cu), whereby it is prevented that the second dielectric layer 19 is separated from the first dielectric layer 14 due to generation of gas during the manufacturing process in the similar manner to the above and thus the semiconductor device with excellent reliability can be manufactured.

Second Embodiment

Figure 4A:
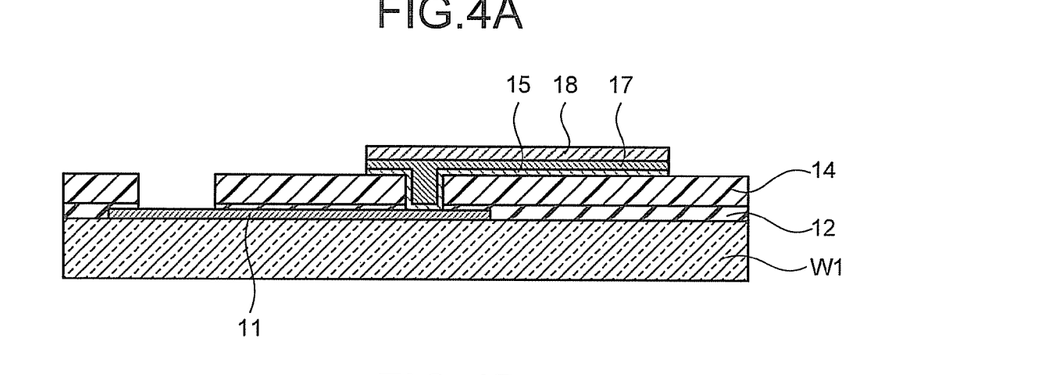
FIG. 4A to FIG. 4C are cross-sectional views schematically explaining a manufacturing method of a semiconductor device in a second embodiment.
Figure 4B:
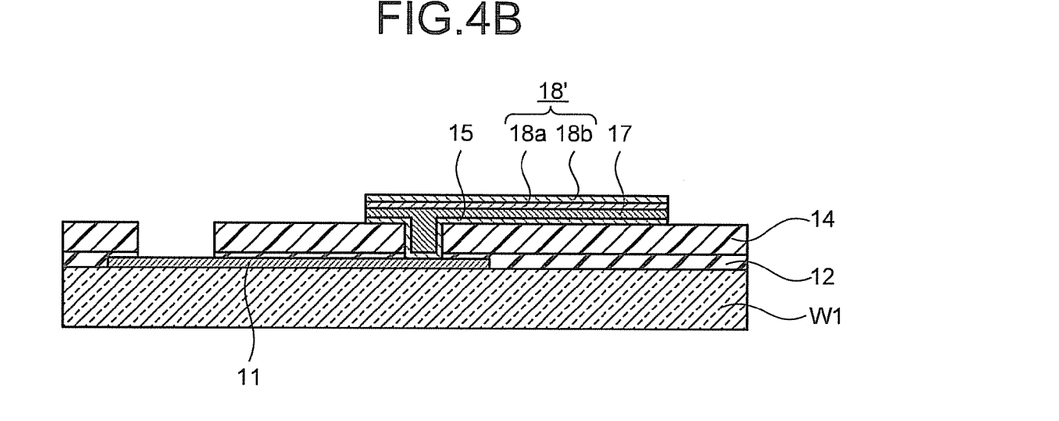
Figure 4C:
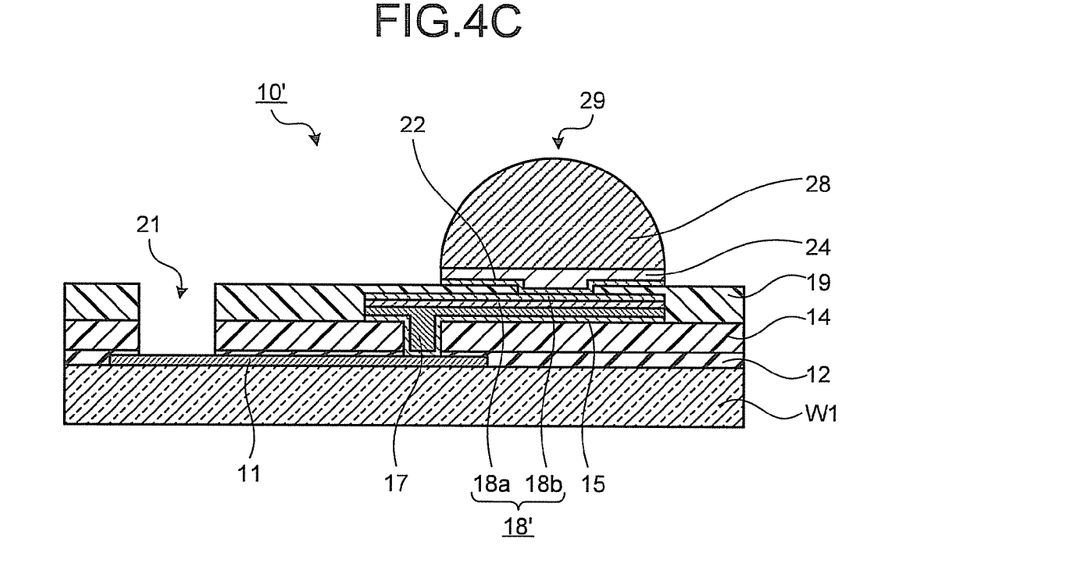

In the second embodiment, a modified example of the first embodiment is explained with reference to FIG. 4A to FIG. 4C. FIG. 4A to FIG. 4C are cross-sectional views schematically explaining a manufacturing method of a semiconductor device according to the second embodiment. First, processes corresponding to FIG. 1A to FIG. 1G in the first embodiment are performed to form the conductive protective layer 18 comprising nickel (Ni) on the redistribution layer 17 as shown in FIG. 4A.

Next, a surface treatment is performed on the surface of the conductive protective layer 18 by any of an organic solution such as alcohol, acetone, hexane, toluene, ethylamine, acetonitrile, tetrahydrofuran (THF), propylene glycol monomethyl ether (PGME), propyleneglycol monomethyl ether acetate (PGMEA), N-methyl-2-pyrrolidone (NMP), dimethyl sulfoxide (DMSO), and N,N-Dimethylformamide (DMF), an alkaline solution such as an ammonium-based solution, a sodium-based solution, and a potassium-based solution, and a mixture of these solutions. A plurality of species can be mixed in the solution used in the surface treatment.

When this surface treatment is performed, nickel oxide (II) (NiO) is formed on the uppermost surface of the conductive protective layer 18, so that the content of nickel oxide (II) (NiO) on the uppermost surface of the conductive protective layer 18 increases. Whereby, as shown in FIG. 4B, a conductive protective layer 18' having a two-layer structure is formed on the redistribution layer 17. The conductive protective layer 18' includes a first conductive protective layer 18a in which nickel (Ni) is the main component and a second conductive protective layer 18b in which the content of nickel oxide (II) (NiO) is larger than the first conductive protective layer 18a and nickel oxide (II) (NiO) is the main component, from the side of the redistribution layer 17. The first conductive protective layer 18a on which the surface treatment is not performed has a composition same as the conductive protective layer 18. The main component means the component having the largest content.

The component such as nickel oxide (III) and nickel hydroxide (Ni(OH)x) has an unstable bonding state to other components. Therefore, it is not preferable in view of adhesion with the second dielectric layer 19 that protects the redistribution layer 17 that these components be the main component on the surface of the conductive protective layer 18. Moreover, a nickel metal component (elemental metal) has no anisotropy in bonding. Therefore, the nickel metal component (elemental metal) is in a state where the nickel metal component cannot bind to an organic film or the like. Thus, metal oxide is formed on the nickel metal component (elemental metal) to create covalent bonds to the organic film or the like, i.e., create a state in which electrons are easily ejected, thus enabling to improve adhesion with the organic film or the like.

On the other hand, nickel oxide (II) (NiO) has a stable bonding state to other components and has adhesion with resin used as the second dielectric layer 19 higher than the nickel metal component (elemental metal).

Thus, in the present embodiment, the second conductive protective layer 18b in which nickel oxide (II) (NiO) is the main component is intentionally formed on a joint surface with the second dielectric layer 19 to improve adhesion between the second dielectric layer 19 and the conductive protective layer 18'. In other words, the second conductive protective layer 18b in which nickel oxide (II) (NiO) that is a component in a stable oxidation state is the main component is arranged on the uppermost surface of the conductive protective layer, so that higher adhesion can be obtained between the conductive protective layer 18' and the second dielectric layer 19. As the second dielectric layer 19 in this case, for example, a phenol-based resin, a polyimide resin, an epoxy resin, or a photosensitive resin such as resin obtained by sensitizing a silicone resin can be used. Among them, when the phenol-based resin is used as the second dielectric layer 19, a remarkable effect can be obtained.

Nickel oxide (II) (NiO) can be formed on the uppermost surface of the conductive protective layer 18, by performing a heat treatment on the surface of the conductive protective layer 18. For example nickel oxide (II) (NiO) can be formed on the uppermost surface of the conductive protective layer 18, by heating the conductive protective layer 18 in oxygen mixture atmosphere or in oxygen-inactive gas atmosphere. Moreover, Nickel oxide (II) (NiO) can be formed on the uppermost surface of the conductive protective layer 18, by performing a plasma treatment on the surface of the conductive protective layer 18. For example nickel oxide (II) (NiO) can be formed on the uppermost surface of the conductive protective layer 18, by exposuring of the conductive protective layer 18 to plasma in oxygen mixture atmosphere or in oxygen-inactive gas atmosphere.

The nickel metal component (elemental metal) is oxidized even by natural oxidation of the surface of the conductive protective layer 18 to form oxide (native oxide). However, the number of bonds of nickel oxide (II) (NiO) and hydroxyl group (OH group) or the like included in an organic film or the like as the second dielectric layer 19 increases significantly by intentionally forming nickel oxide (II) (NiO) by the surface treatment as described above. Therefore, adhesion between the conductive protective layer 18' and the second dielectric layer 19 is improved compared with the case where the uppermost surface is the native oxide.

The thickness of the conductive protective layer 18' is, for example, 1 nm to 10 µm, and preferably 1 nm to 5 µm. When the thickness of the conductive protective layer 18' is smaller than 1 nm, the conductive protective layer 18' is formed in the form of islands although it depends on a film forming method or the like, so that the conductive protective layer 18' does not function as the conductive protective layer. When the thickness of the conductive protective layer 18' is larger than 10 µm, it takes time to form a plating film, which affects the throughput. Therefore, the conductive protective layer 18' is preferably a continuous film and as thin as possible.

After forming the conductive protective layer 18', processes corresponding to FIG. 1H to FIG. 1N in the first embodiment are performed. Whereby, as shown in FIG. 4C, a first semiconductor chip 10' is obtained in which the solder bump 28 is formed on the redistribution layer 17 (on the barrier metal layer 24) to form the external connection terminal 29. The first semiconductor chip 10' is different from the first semiconductor chip 10 in that the first semiconductor chip 10' includes the conductive protective layer 18' instead of the conductive protective layer 18. The processes as above are performed, so that it is prevented that the second dielectric layer 19 is separated from the redistribution layer 17 and further from the first dielectric layer 14 due to generation of gas during the manufacturing process and thus the semiconductor device with excellent reliability can be manufactured.

In the above, the case is explained in which the conductive protective layer 18 is formed of nickel (Ni), however, the metal material of the conductive protective layer 18, for example, includes manganese (Mn), tantalum (Ta), zinc (Zn), chrome (Cr), cobalt (Co), tin (Sn), and lead (Pb) in addition to nickel (Ni). In this case also, the content of the component of stable metal oxide on the uppermost surface of the conductive protective layer 18 is increased by performing the surface treatment on the surface of the conductive protective layer 18. Whereby, the conductive protective layer 18' having a two-layer structure including the first conductive protective layer 18a in which a metal component is the main component and the second conductive protective layer 18b in which metal oxide is the main component is formed on the redistribution layer 17.

Moreover, in the similar manner to the first embodiment, the chip-stack semiconductor device similar to the chip-stack semiconductor device shown in FIG. 3 can be configured by stacking the first semiconductor chip 10' and the second semiconductor chip 40 as another electronic component by using the COC method. In such a chip-stack semiconductor device, it is prevented more surely that the second dielectric layer 19 is separated from the redistribution layer 17 and further from the first dielectric layer 14 due to generation of gas during the manufacturing process of the first semiconductor chip 10' and thus the chip-stack semiconductor device with excellent reliability can be manufactured.

As described above, the semiconductor device according to the present embodiment includes the conductive protective layer 18' having a two-layer structure including the first conductive protective layer 18a in which nickel (Ni) is the main component and the second conductive protective layer 18b in which the content of nickel oxide (II) (NiO) is larger than the first conductive protective layer 18a and nickel oxide (II) (NiO) is the main component from the side of the redistribution layer 17, on the redistribution layer 17 comprising copper (Cu). Therefore, separation of the second dielectric layer 19 from the redistribution layer 17 and separation of the second dielectric layer 19 from the first dielectric layer 14 at the time of forming the second dielectric layer 19 are prevented and thus the semiconductor device with more excellent reliability can be manufactured.

Moreover, as described above, in the manufacturing method of the semiconductor device according to the present embodiment, the conductive protective layer 18' having a two-layer structure including the first conductive protective layer 18a in which nickel (Ni) is the main component and the second conductive protective layer 18b in which the content of nickel oxide (II) (NiO) is larger than the first conductive protective layer 18a and nickel oxide (II) (NiO) is the main component is laminated to the redistribution layer 17 comprising copper (Cu). Therefore, in the similar manner to the case of the first embodiment, the cell effect (electrolysis) due to the potential difference between two types of dissimilar metals present in the developer is suppressed significantly and therefore the amount of gas to be generated, such as hydrogen ($H_2$) gas and oxygen ($O_2$) gas, at the development of the photosensitive polyimide film is reduced significantly. Therefore, it is prevented that the photosensitive polyimide film to be the second dielectric layer 19 is separated from the redistribution layer 17 and further from the first dielectric layer 14 due to generation of gas and thus the semiconductor device with excellent reliability can be manufactured.

Furthermore, the second conductive protective layer 18b in which the content of nickel oxide (II) (NiO) is larger than the first conductive protective layer 18a and nickel oxide (II) (NiO) is the main component is arranged on the surface layer of the conductive protective layer 18'. Whereby, higher adhesion is obtained between the conductive protective layer 18' and the second dielectric layer 19, so that it is prevented more surely that the photosensitive polyimide film to be the second dielectric layer 19 is separated from the redistribution layer 17 and further from the first dielectric layer 14 due to generation of gas and thus the semiconductor device with excellent reliability can be manufactured.

In the present embodiment also, a constituent material of the electrode pad 11 and a constituent material of the redistribution layer 17 in the first semiconductor chip 10' can be arbitrary changed from the similar reason to the first embodiment.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the sprit of the inventions. The accompanying claims and their equivalents are intended to cover such forms or modifications as would fall within the scope and spirit of the inventions.

What is claimed is:

1. A semiconductor device comprising:
a semiconductor substrate that is provided with a semiconductor element and an electrode terminal including a first conductive layer for the semiconductor element on a surface;
a first dielectric layer that is formed on a main surface on which the electrode terminal is provided of the semiconductor substrate, has a first opening and a second opening reaching the electrode terminal in an area on the electrode terminal, and is formed by modifying a photosensitive resin;
a redistribution that is provided to fill in at least the first opening and includes a second conductive layer that is electrically connected to the electrode terminal;
a conductive protective layer that is formed on an uppermost layer of the redistribution, and includes a third conductive layer that has an oxidation-reduction potential of which difference from the oxidation-reduction potential of the first conductive layer is smaller than a difference of the oxidation-reduction potential between the first conductive layer and the second conductive layer;
a second dielectric layer that is formed on the first dielectric layer and the conductive protective layer, has a third opening reaching the conductive protective layer and a fourth opening reaching the electrode terminal via the second opening, and is formed by modifying a photosensitive resin; and
a bump that fills in at least the third opening and is formed on the conductive protective layer.

2. The semiconductor device according to claim 1, wherein the first conductive layer comprises aluminum, the second conductive layer comprises copper, and the third conductive layer comprises at least one metal selected from the group consisting of manganese, tantalum, zinc, chrome, cobalt, nickel, tin, and lead.

3. The semiconductor device according to claim 1, wherein the conductive protective layer includes a first conductive protective layer including the third conductive layer formed on the redistribution and a second conductive protective layer that includes metal oxide of the third conductive layer more than the first conductive protective layer and is formed on the first conductive protective layer.

4. The semiconductor device according to claim 3, wherein the first conductive layer comprises aluminum, the second conductive layer comprises copper, and the third conductive layer comprises at least one metal selected from the group consisting of manganese, tantalum, zinc, chrome, cobalt, nickel, tin, and lead.

5. The semiconductor device according to claim 4, wherein the third conductive layer is nickel and the metal oxide is nickel oxide (II).

* * * * *